(12) United States Patent
Hwang et al.

(10) Patent No.: US 7,842,593 B2
(45) Date of Patent: Nov. 30, 2010

(54) SEMICONDUCTOR DEVICE AND METHOD FOR FABRICATING THE SAME

(75) Inventors: Chang Youn Hwang, Icheon-Si (KR); Hyun Ahn, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 64 days.

(21) Appl. No.: 11/771,478

(22) Filed: Jun. 29, 2007

(65) Prior Publication Data
US 2008/0150014 A1   Jun. 26, 2008

(30) Foreign Application Priority Data
Dec. 26, 2006   (KR) .................. 10-2006-0134080

(51) Int. Cl.
*H01L 21/3205* (2006.01)

(52) U.S. Cl. ............... 438/586; 438/665; 257/E21.585

(58) Field of Classification Search ......... 438/597–680, 438/586, 589, 238, 241; 257/E21.583, E21.585
See application file for complete search history.

(56) References Cited

U.S. PATENT DOCUMENTS

| 6,159,850 | A  | * | 12/2000 | Lee et al. ............... 438/665 |
| 6,479,377 | B1 | * | 11/2002 | Tang et al. .............. 438/618 |
| 6,573,168 | B2 | * | 6/2003  | Kim et al. .............. 438/586 |
| 6,723,655 | B2 | * | 4/2004  | Park et al. ............. 438/742 |
| 6,881,650 | B2 | * | 4/2005  | Lee et al. .............. 438/481 |
| 6,881,659 | B2 | * | 4/2005  | Park et al. ............. 438/618 |
| 7,229,893 | B2 |   | 6/2007  | Wang et al. ............. 438/424 |
| 2006/0030095 | A1 | * | 2/2006 | Goh et al. ............. 438/199 |
| 2006/0138477 | A1 |   | 6/2006 | Suh ..................... 257/288 |
| 2006/0183320 | A1 | * | 8/2006 | Cha et al. ............. 438/637 |
| 2006/0208282 | A1 | * | 9/2006 | Tran et al. ............. 257/206 |
| 2007/0275555 | A1 | * | 11/2007| Kim ..................... 438/637 |

FOREIGN PATENT DOCUMENTS

| CN | 1674255 A | 9/2005 |
| CN | 1725507 | 1/2006 |
| CN | 1794467 | 6/2006 |
| KR | 10 2005 0042350 A | 5/2005 |
| KR | 10 2005 0045715 A | 5/2005 |
| KR | 10 2006 0074994 A | 7/2006 |
| KR | 10 2006 0127515 A | 12/2006 |

OTHER PUBLICATIONS

First Office Action for Chinese Application No. 200710130156.1, dated Jun. 5, 2009.

* cited by examiner

*Primary Examiner*—Matthew W Such
*Assistant Examiner*—Ali Naraghi
(74) *Attorney, Agent, or Firm*—Marshall, Gerstein & Borun LLP

(57) ABSTRACT

A method for fabricating a semiconductor device includes forming a recess gate over a semiconductor substrate. A gate spacer is formed on a sidewall of the recess gate. The semiconductor substrate in a landing plug contact region is soft-etched to form a recess having a rounded profile. A sidewall spacer is formed over the gate spacer and a sidewall of the recess. An insulating film is formed over the semiconductor substrate. The insulating film is selectively etched to form a landing plug contact hole. A conductive layer in the landing plug contact hole is filled to form a landing plug.

13 Claims, 3 Drawing Sheets

SEMICONDUCTOR DEVICE AND METHOD FOR FABRICATING THE SAME

CROSS-REFERENCE TO RELATED APPLICATION

The priority of Korean patent application number 10-2006-0134080, filed on Dec. 26, 2006, the entire disclosure of which is incorporated by reference in its entirety, is claimed.

BACKGROUND

The invention relates generally to a semiconductor device. More particularly, the invention relates to a semiconductor device comprising a landing plug and a method for fabricating the same.

Due to increasing degrees of integration of semiconductor devices, intervals between conductive lines, such as gates, have decreased in size. As a result, process margins of forming contacts between the conductive lines have been reduced. In order to secure the process margins of forming contacts, a self-aligned contact ("SAC") process is performed.

FIGS. 1a and 1b are cross-sectional views illustrating a method for fabricating a semiconductor device according to the prior art. A device isolation structure (not shown) that defines an active region is formed over a semiconductor substrate 10. A portion of the semiconductor substrate 10 is etched by a photolithography process using a mask that defines a recess gate region, to form a recess gate region (not shown) A gate insulating film (not shown) is formed over the active region and in the recess gate region. A recess gate 12, which includes a stacked structure of a gate polysilicon layer 12a, a tungsten layer 12b, and a gate hard mask layer 12c, is formed over the gate insulating film. A gate spacer 14 is formed on a sidewall of the recess gate 12. An interlayer insulating film 16 is formed over the semiconductor substrate 10. A portion of the interlayer insulating film 16 is removed by a self aligned contact ("SAC") etching process to form a landing plug contact hole (not shown) that exposes the active region. A conductive layer is filled in the landing plug contact hole to form a landing plug 18.

When the recess gate 12 and the recess gate region are misaligned, when a critical dimension ("CD") of the upper portion in recess gate region is expanded in a subsequent process, or when a CD of the recess gate 12 is reduced, the recess gate region is not covered by the recess gate 12 but is partially exposed (see FIG. 1b). In the SAC etching process, an overlapping margin between the recess gate region and the landing plug 18 results in the generation of an SAC fail ('A') between recess gate 12 and landing plug 18.

SUMMARY

Embodiments consistent with the invention relate to a semiconductor device comprising a landing plug, and a method for fabricating the same. In one embodiment, a portion of a semiconductor substrate in a landing plug contact region is soft-etched. A sidewall spacer is formed over a gate spacer and a sidewall of the etched semiconductor substrate in the landing plug contact region. Accordingly, an SAC fail is prevented in the process of forming a landing plug contact hole.

According to one embodiment, a method for fabricating a semiconductor device comprises the steps of: forming a recess gate over a semiconductor substrate; forming a gate spacer on a sidewall of the recess gate; soft-etching the semiconductor substrate in a landing plug contact region thereof to form a recess having a rounded profile; forming a sidewall spacer over the gate spacer and a sidewall of the recess; forming an insulating film over the semiconductor substrate; selectively etching the insulating film to form a landing plug contact hole; and filling a conductive layer in the landing plug contact hole to form a landing plug.

According to another embodiment, a semiconductor device is fabricated according to the above-described method.

DETAILED DESCRIPTION

Figure 1A:
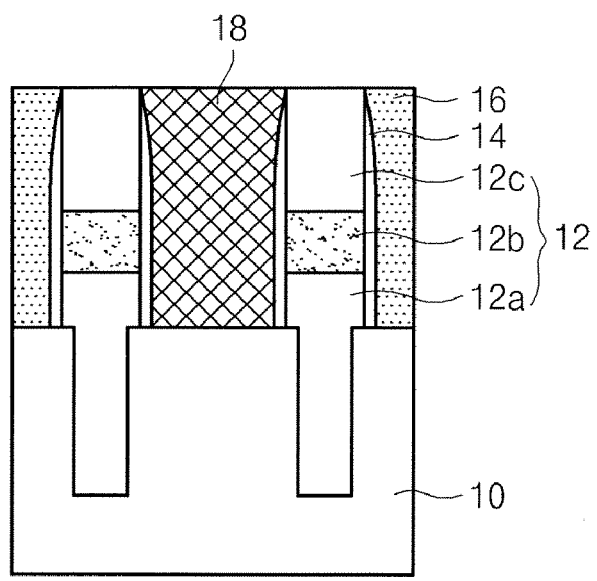
FIGS. 1a and 1b are cross-sectional views illustrating a method for fabricating a semiconductor device according to the prior art.
Figure 1B:
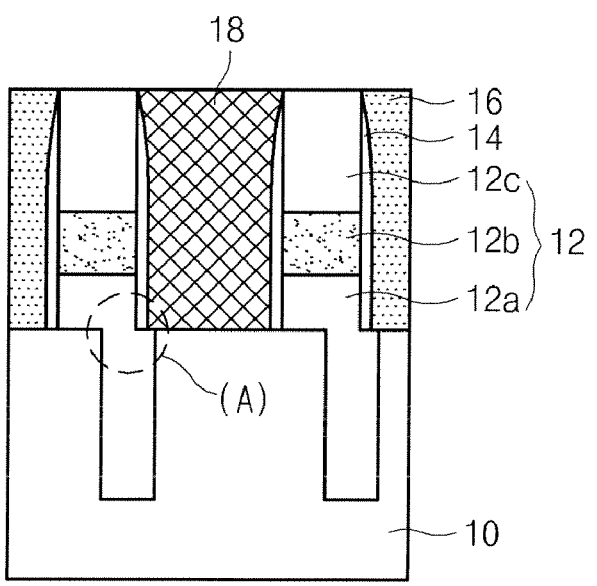
Figure 2A:
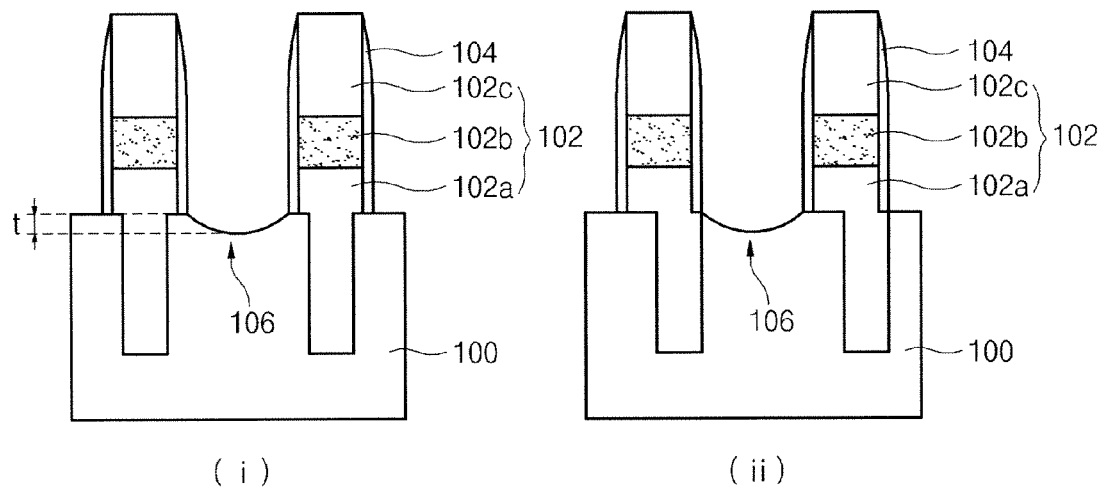
FIGS. 2a to 2c are cross-sectional views illustrating a method for fabricating a semiconductor device according to an embodiment consistent with the invention.
Figure 2B:
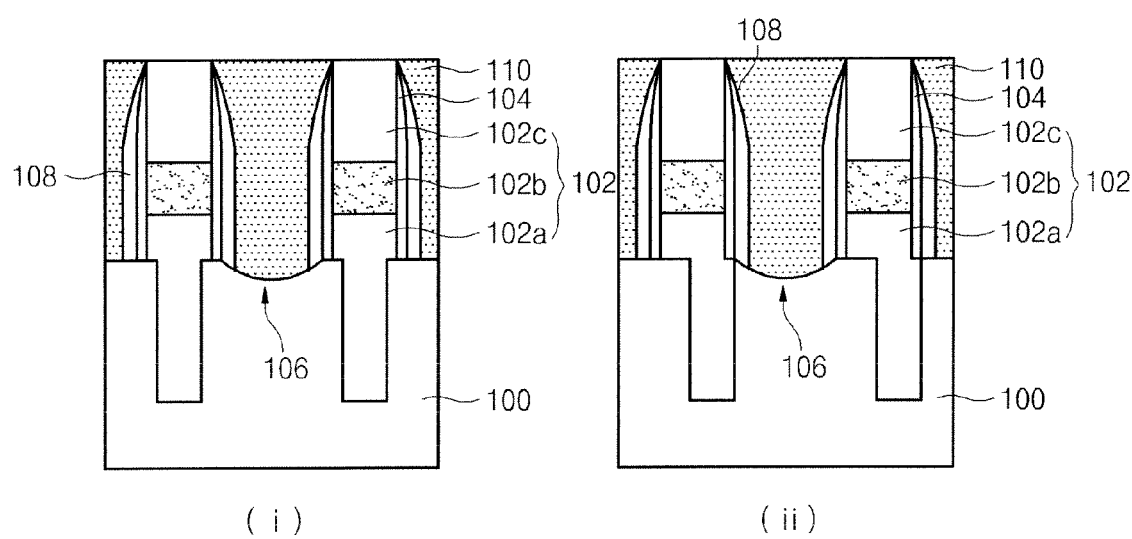
Figure 2C:
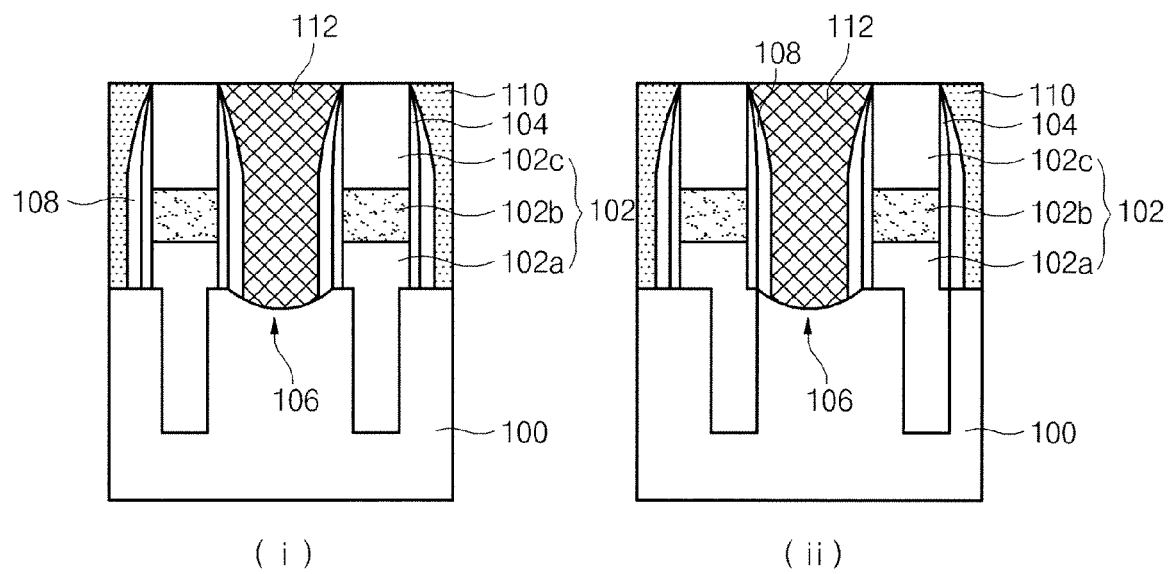

FIGS. 2a to 2c are cross-sectional views illustrating a method for fabricating a semiconductor device according to an embodiment consistent with the invention. FIGS. 2a(i), 2b(i), and 2c(i) show when a recess gate and a recess gate region are aligned and FIGS. 2a(ii), 2b(ii), and 2c(ii) show when a recess gate and a recess gate region are misaligned. A device isolation structure (not shown) that defines an active region is formed over a semiconductor substrate 100. A portion of the semiconductor substrate 100 is etched, preferably using a photolithography process, with a mask that defines a recess gate region, to form a recess gate region (not shown). A gate insulating film (not shown) is then formed in the recess gate region. A gate polysilicon layer (not shown), a tungsten layer (not shown), and a gate hard mask layer (not shown) are then sequentially formed over the gate insulating film.

In one embodiment, a thickness of the gate polysilicon layer is preferably in a range of about 500 Å to 2,000 Å. A thickness of the tungsten layer is preferably in a range of about 500 Å to 1,500 Å. The gate hard mask layer preferably includes a nitride film, preferably having a thickness in a range of about 1,000 Å to 3000 Å. A barrier metal layer (not shown) is further formed between the gate polysilicon layer and the tungsten layer. The barrier metal layer is preferably selected from the group consisting of titanium (Ti) layers, tungsten nitride (WN) layers, titanium nitride (TiN) layers, and combinations thereof, preferably with a thickness in a range of about 100 Å to 500 Å.

Next, a first hard mask layer (not shown) and a first photoresist film (not shown) are sequentially formed over the gate hard mask layer. The first photoresist film is exposed and developed with a gate mask to form a first photoresist pattern (not shown). The first hard mask layer, the gate hard mask layer, the gate tungsten layer, and the gate polysilicon layer are then patterned using the first photoresist pattern as a mask, to form a first hard mask pattern (not shown), a gate hard mask pattern 102c, a tungsten pattern 102b, and a gate polysilicon pattern 102a.

In one embodiment, the first hard mask layer is preferably an amorphous carbon layer. The process of etching the gate hard mask layer is preferably performed under power in a range of about 100 W to 1,500 W and a pressure in a range of about 1 mTorr to 20 mTorr under an atmosphere of gas selected from the group consisting of $CF_4$, $CHF_3$, $O_2$, Ar, $SF_6$ and combinations thereof. The process of etching the tungsten layer is preferably performed under a power in a range of about 10 W to 1,500 W and a pressure in a range of about 2 mTorr to 20 mTorr under an atmosphere selected from the group consisting of $NF_3$, $Cl_2$, $O_2$, $N_2$, He, and combinations thereof.

The first photoresist pattern and the first hard mask pattern are then removed to form a recess gate including a stacked structure having the gate hard mask pattern 102c, the tungsten pattern 102b, and the gate polysilicon pattern 102a. A first nitride film (not shown) is then formed over the semiconductor substrate 100. A process of forming a spacer that includes etching and cleaning processes is then performed to form a gate spacer 104 on a sidewall of the recess gate 102. The semiconductor substrate 100 is then soft-etched in a landing plug contact region by a chemical etch method to form a recess 106 having a rounded profile. The chemical etch method is preferably performed using a neutral radical ion activated at a plasma state.

In one embodiment, a thickness of gate spacer 104 is preferably in a range of about 50 Å to 100 Å. The soft-etching process is preferably performed under a power in a range of about 500 W to 3,000 W and a pressure in a range of about 500 mTorr to 2,000 mTorr under an atmosphere selected from the group consisting of $NF_3$, $O_2$, He, and combinations thereof. A depth t (FIG. 2a(ii)) of the recess 106 is preferably in a range of about 50 Å to 200 Å.

Referring to FIGS. 2b and 2c, a sidewall spacer 108 is formed over gate the spacer 104 and on a sidewall of the recess 106. An interlayer insulating film 110 is then formed over semiconductor substrate 100 to cover the recess gate 102. A wet annealing process is preferably performed to densify the film quality of the interlayer insulating film 110. A planarization process is preferably performed until the gate hard mask pattern 102c is exposed.

In one embodiment, the sidewall spacer 108 serves as a barrier film to prevent an upper portion of the recess gate region from being exposed in a subsequent wet cleaning process including a wet etching solution. A thickness of the sidewall spacer 108 is preferably in a range of about 130 Å to 300 Å. The interlayer insulating film 110 is preferably formed of a boro-phospho-silicate-glass ("BPSG") film, preferably with a thickness in a range of about 3,000 Å to 8,000 Å. The planarization process is preferably performed by a chemical mechanical polishing ("CMP") method.

Next, a second hard mask layer (not shown) and a second photoresist film (not shown) are formed over the interlayer insulating film 110. The second photoresist film is exposed and developed using a landing plug contact mask (not shown) to form a second photoresist pattern (not shown). The second hard mask layer and the interlayer insulating film 110 are then etched using the second photoresist pattern to form a second hard mask pattern (not shown) and a landing plug contact hole (not shown). The second photoresist pattern and the second hard mask pattern are then removed. A wet cleaning process is then performed on the semiconductor substrate 100 and in the landing plug contact hole.

In one embodiment, the second hard mask layer is an amorphous carbon layer. The process of etching the interlayer insulating film 110 is preferably performed under a power in a range of about 500 W to 2,000 W and a pressure in a range of about 10 mTorr to 150 mTorr under an atmosphere of gas selected from the group consisting of $CF_4$, $CHF_3$, $O_2$, $N_2$, $C_4F_6$, Ar, and combinations thereof. The wet cleaning process is preferably performed to remove polymers generated when the interlayer insulating film 110 is etched and to increase the size of the landing plug contact hole. The wet cleaning process is preferably performed using a Buffered Oxide Etchant (BOE) solution including at least one member selected from the group consisting of $H_2SO_4$, $H_2O_2$, and combinations thereof.

Thereafter, a conductive layer is filled over the semiconductor substrate 100 and in the landing plug contact hole. A planarization process is then performed on the conductive layer to form a landing plug 112 (FIG. 2"c"). The conductive layer preferably is a polysilicon layer, preferably with a thickness in a range of about 1,000 Å to 3,000 Å.

As described above, in a method for fabricating a semiconductor device according to an embodiment consistent with invention, a semiconductor substrate in a local landing plug contact region is soft-etched preferably by a chemical etch process, to form a recess. A sidewall spacer is formed over a gate spacer and a sidewall of the recess, to prevent exposure of a recess gate region resulting from misalignment between a recess gate and a recess gate region. As a result, an SAC fail is prevented when a landing contact hole is formed, thereby obtaining an improved landing plug to improve yield and characteristics of the device.

The described embodiments of the invention are illustrative and not limiting. Various alternatives and equivalents are possible. The invention is not limited by the type of deposition, etching polishing, and patterning steps described herein, nor is the invention limited to any specific type of semiconductor device. For example, the invention may be implemented in a dynamic random access memory (DRAM) device or in a non-volatile memory device, for example, other additions, subtractions, or modifications are intended to fall within the scope of the appended claims.

What is claimed is:

1. A method for fabricating a semiconductor device, the method comprising the steps of:
   forming a recess gate having sidewalls over a semiconductor substrate defining a landing plug contact region;
   forming a gate spacer on a sidewall of the recess gate;
   soft-etching the semiconductor substrate in the landing plug contact region to form a recess having a rounded bottom and a sidewall;
   forming a sidewall spacer only over the gate spacer and the sidewall of the recess, wherein the sidewall spacer is thicker than the gate spacer;
   forming an insulating film over the semiconductor substrate including the recess gate, the recess gate spacer, and the recess;
   performing a planarization process on the insulating film to expose the recess gate;
   selectively etching the insulating film to form a landing plug contact hole; and
   filling the landing plug contact hole with a conductive layer to form a landing plug.

2. The method of claim 1, wherein the gate spacer has a thickness in a range of about 50 Å to 100 Å.

3. The method of claim 1, comprising performing the soft-etching process for the recess by a chemical etching method.

4. The method of claim 1, comprising performing the soft-etching process under a power in a range of about 500 W to about 3,000 W and a pressure in a range of about 500 mTorr to about 2,000 mTorr under an atmosphere selected from the group consisting of NF3, O2, He, and combinations thereof.

5. The method of claim 1, wherein the recess has a depth in a range of about 50 Å to about 200 Å.

6. The method of claim 1, wherein the sidewall spacer has a thickness in a range of about 130 Å to about 300 Å.

7. The method of claim 1, wherein the interlayer insulating film comprises a boro-phospho-silicate-glass ("BPSG") film with a thickness in a range of about 3,000 Å to about 8,000 Å.

8. The method of claim 1, further comprising performing a wet annealing process on the interlayer insulating film.

9. The method of claim 1, comprising performing the process of selectively etching the interlayer insulating film under a power in a range of about 500 W to about 2,000 W and a pressure in a range of about 10 mTorr to about 150 mTorr under an atmosphere of gas selected from the group consisting of CF4, CHF3, O2, N2, C4F6, Ar, and combinations thereof.

10. The method of claim 1, further comprising performing a wet cleaning process on the landing plug contact hole.

11. The method of claim 10, comprising performing the wet cleaning process using a Buffered Oxide Etchant (BOE) solution including at least one member selected from the group consisting of H2SO4, H2O2, and combinations thereof.

12. The method of claim 1, wherein the conductive layer comprises a polysilicon layer with a thickness in a range of about 1,000 Å to about 3,000 Å.

13. A semiconductor device fabricated according to the method of claim 1.

* * * * *